(12) United States Patent
Hariharan et al.

(10) Patent No.: US 6,479,108 B2
(45) Date of Patent: Nov. 12, 2002

(54) PROTECTIVE LAYER FOR QUARTZ CRUCIBLES USED FOR SILICON CRYSTALLIZATION

(75) Inventors: Alleppey V. Hariharan, Nashua, NH (US); Mohan Chandra, Merrimack, NH (US); Michael Costantini, Hudson, NH (US); Yuepeng Wan, Nashua, NH (US)

(73) Assignee: G.T. Equipment Technologies, Inc., Nashua, NH (US)

( * ) Notice: Subject to any disclaimer, the term of this patent is extended or adjusted under 35 U.S.C. 154(b) by 0 days.

(21) Appl. No.: 09/944,790

(22) Filed: Aug. 31, 2001

(65) Prior Publication Data

US 2002/0086119 A1 Jul. 4, 2002

Related U.S. Application Data

(60) Provisional application No. 60/248,880, filed on Nov. 15, 2000, and provisional application No. 60/259,553, filed on Jan. 3, 2001.

(51) Int. Cl.$^7$ .................................................. C23C 4/10
(52) U.S. Cl. ........................................ 427/453; 427/446
(58) Field of Search .................................. 427/446, 453

(56) References Cited

U.S. PATENT DOCUMENTS

| | | |
|---|---|---|
| 4,039,697 A | 8/1977 | Isawa et al. |
| 4,090,851 A | 5/1978 | Berkman et al. |
| 4,099,924 A | 7/1978 | Berkman et al. |
| 4,218,418 A | 8/1980 | Schmid et al. |
| 4,429,009 A | 1/1984 | Pastor et al. |
| 4,505,948 A | 3/1985 | Pinkhasov |
| 4,565,711 A | 1/1986 | Pinkhasov |
| 4,741,925 A | 5/1988 | Chaudhuri et al. |
| 4,935,046 A | 6/1990 | Uchikawa et al. |
| 5,934,900 A * | 8/1999 | Billings ...................... 432/264 |
| 5,976,247 A | 11/1999 | Hansen et al. |
| 5,980,629 A * | 11/1999 | Hansen et al. ................. 117/13 |

FOREIGN PATENT DOCUMENTS

| | | | |
|---|---|---|---|
| JP | 52038873 | | 3/1977 |
| JP | 60137892 | | 7/1985 |
| JP | 63-206397 | * | 8/1988 |
| JP | 03-115535 | * | 5/1991 |
| JP | 4-6198 | * | 1/1992 |

OTHER PUBLICATIONS

Thermal Spraying: Practice, Theory, and Application, American Welding Society, Inc., 1985, pp. 9–11 and 56. (no month date).*

Ravishankar, P.S., Liquid Encapsulated Bridgman (LEB) Method for Directional Solidification of Silicon Using Calcium Chloride, Journal of Crystal Growth, 94 (1989) pp. 62–68 (no month date).

Saito, Takeshi, Shimura, Akio and Ichikawa, Shoji, A Reusable Mold in Directional Solidification for Silicon Solar Cells, Solar Energy Materials 9, (1983), pp. 337–345 (no month date).

PCT International Search Report dated Dec. 4, 2001 of International Application No. PCT/US01/27070 filed Aug. 31, 2001.

* cited by examiner

*Primary Examiner*—Katherine A. Bareford
(74) *Attorney, Agent, or Firm*—Vernon C. Maine; Maine & Asmus

(57) ABSTRACT

A thermodynamically stable, protective coating layer is applied by thermal spray technique to the inner and outer surfaces of a quartz crucible used for mono or polycrystalline silicon crystallization processing, inhibiting fusion between the silicon melt and the vitreous silica of the crucible, contamination of the silicon melt by contaminants released from the crucible by devitrification, and any chemical reaction occurring between the crucible and any supporting graphite structure. A powdered form of a suitable protective coating material compatible with high temperature plasma spray techniques, such as magnesium zirconate, barium zirconate, or stabilized zirconium oxide, is fed into a high temperature and high speed plasma jet directed at the crucible. The powder particles are softened or melted in the jet and deposited on the surfaces of the quartz crucible, and allowed to cool and harden into a protective coating.

20 Claims, No Drawings

PROTECTIVE LAYER FOR QUARTZ CRUCIBLES USED FOR SILICON CRYSTALLIZATION

This application relates, incorporates by reference and claims priority to pending U.S. provisional patent applications Ser. No. 60/248,880, filed Nov. 15, 2000, and No. 60/259,553, filed Jan 3, 2001, both applications being commonly owned with the present application.

TECHNICAL FIELD OF THE INVENTION

This invention relates generally to crucibles for use in the preparation of silicon crystals. The invention particularly relates to protective coating layers that are applied to the inner surface or both inner and outer surfaces of a silica crucible. The invention also relates to a process that forms the said protective coating.

BACKGROUND OF THE INVENTION

Crystal growth from melt that is contained in a crucible is a common way to prepare semiconductor materials. The materials for such a crucible are generally fused silica (also known as fused quartz) and graphite. Quartz crucibles are extensively used because of its availability in very high purity and comparatively lower reactivity with molten silicon. For instance, they are invariably used to grow single crystalline silicon in the Czo-chralski (CZ) process, where almost the entire melt is pulled out of the crucible during crystallization of silicon. Also, quartz crucibles are often used in directional solidification technique, the heat exchanger method (HEM), for example, to grow polycrystalline silicon, where the melt is solidified inside the crucible.

Besides the unique beneficial properties of quartz materials, there are a number of difficulties experienced in employing quartz crucibles when the temperature of the crucible is close to or exceeds the melting point of silicon. A major problem associated with the crucible that is composed of vitreous silica is its gradual devitrification, during which cristobalite islands are formed in the vitreous silica surface. The cristobalite islands can be released as particulate into silicon melt and cause dislocations in the silicon ingot. Another problem with quartz crucibles at high temperature is the deformation of the crucible because of the softness of vitreous silica at temperatures exceeding the melting point of silicon. For this reason, graphite susceptors are usually used to support the crucibles. However, the use of graphite susceptors may induce buckling of the quartz crucible during a prolonged holding period at high temperature. Moreover, graphite reacts with silica and forms carbon monoxide. The gaseous carbon monoxide diffuses onto the surface of silicon melt and forms the more stable silicon carbide which contaminates the melt. There is a particular problem related to the crucible used in directional solidification of polycrystalline silicon ingot where the melt is solidified inside the crucible in a controlled manner. At high temperature molten silicon reacts with quartz, and during solidification both silicon and quartz adhere with each other. Consequently, due to difference in the coefficient of thermal expansion, both crucible and ingot crack when they are cooled down.

A number of approaches has been suggested to overcome the above mentioned difficulties. The problems of gradual devitrification and loss of structural integrity of quartz crucibles in CZ process have been tackled by surface treatment of crucibles using several different processing methods. U.S. Pat. No. 4,429,009 describes a process for converting the vitreous silica surfaces of a crucible to cristobalite for passivating and enhancing the stability of the surface. In this process, the vitreous silica surfaces are converted to β-cristobalite at a temperature of 1200° C. to 1400° C. in an atmosphere containing atomic iodine for a period of about 24 hours. The β-cristobalite is transformed to α-cristobalite when the surface is cooled back to a temperature of less than 260° C. When the crucible is thereafter reheated in a CZ furnace for crystal growth, the α-cristobalite layer transforms back to β-cristobalite at temperatures around the melting point of silicon. This β-cristobalite serves as a protective layer between the crucible and the silicon melt as well as a reinforcing layer on the outer surface of the crucible. A problem with this process is the possibility of cracking the devitrified surface during the phase transformation of α-cristobalite to β-cristobalite. Particulates formed by the cracking can be released into the silicon melt and cause the formation of dislocations in the silicon ingot.

U.S. Pat. No. 5,976,247 provides another way to form the preventive devitrified cristobalite layer during crystal growth process. By applying a thin layer of devitrification promoter on both sides of a crucible, which is preferably an oxide, hydroxide, carbonate or silicate of an alkaline-earth metal, a layer of substantially devitrified silica is formed on both sides when polysilicon material is melted in the crucible. The substantially devitrified silica layer on the inner surface significantly reduces the release of crystalline silica particulates into the silicon melt, while the layer on the outer surface reinforces the vitreous silica body.

U.S. Pat. No. 4,935,046 describes a quartz crucible having an opaque outer substrate of a quartz glass with a relatively high bubble content and an inner transparent glass layer that is substantially free from bubbles. The crucible is claimed to exhibit a stable dissolving rate of the crucible material into the melt and has a minimum possibility of causing cristobalite on the inner surface during the crystal growth process. The forming of both inner and outer glass surfaces is integrated in the fabrication of the crucible.

Other surface treatment methods have also been proposed to remove electrostatically adhering metallic contaminants from the inner surface of crucibles for the purpose of reducing the incidence of lattice defects and crucible deformation. Japanese Kokai No. 52/038873 suggests the use of a xenon lamp to irradiate the inner crucible surface to remove the metallic contaminants. Another method of subjecting a crucible to electrolysis is disclosed by Japanese Kokai No. 60/137892 to remove alkali metals. Both of these treatments do not address the control of the devitrification process in the presence of molten silicon.

Solutions to the adhesion problem encountered in directional solidification of polycrystalline silicon are mostly related to applying a protective coating layer on the inner walls of the quartz crucible. This thin layer acts essentially as a releasing agent. Among several materials for the coating layer, silicon nitride is the most widely used one. Saito et al. (A Reusable Mold in Directional Solidification for Silicon Solar Cells, in Solar Energy Materials, Vol. 9, (1983), p.337) reported the successful growth of polycrystalline silicon ingot by employing a coating layer of silicon nitride powder on the inner surface of a crucible.

Several different processes have been proposed for the preparation of the silicon nitride layer. A method of pyrolysis is proposed in U.S. Pat. No. 4,741,925, wherein reactive gases are fed through a tube into the crucible while the crucible walls are maintained at a temperature of at least about 1250° C. U.S. Pat. No. 4,565,711 discloses a method of using vapor generator in which granules of a low electrical conductivity and low thermal conductivity silicon materials are disposed between a pair of electrodes. The electric current passing through the granules causes the localized vaporization at the contact points between granules. The vaporized silicon reacts thereafter with the carrier gas nitrogen and forms silicon nitride on the crucible surface.

In an improved crucible coating system, a suspension is prepared by mixing the coating materials, for example silicon nitride, in powder form with a binder and defoamer in water. Such suspension is then spray-painted on the inner surface of the crucible. During spray painting, the inner surface is heated at a temperature of about 43°–65° C. in order to facilitate rapid drying of the coating. The dry release coating is then transferred to a kiln which will heat the crucible to remove the binder by thermal decomposition. The finished coating is intended to possess strength sufficient to maintain coating integrity during loading and manipulation of the crucible into a polysilicon growth furnace. Other coating methods for silicon nitride deposition can also be found in U.S. Pat. No. 4,090,851, U.S. Pat. No. 4,039,697, and some other publications. Other materials, such as silicon oxynitride (U.S. Pat. No. 4,099,924) and silicon carbide (U.S. Pat. No. 4,505,948) are also used as the protective and releasing agents.

In addition to the above mentioned solid protective layers, a melt layer between the inner crucible surface and the silicon melt is also an effective approach to help release in-got from the crucible in a directional solidification method. Ravishankar (Liquid Encapsulated Bridgman (LEB) Method for Directional Solidification of Silicon Using Calcium Chloride, Journal of Crystal Growth, 94, 62–68, 1989) published a liquid encapsulation method in a Bridgman directional solidification process. In this method, calcium chloride is coated on the inner surface of a quartz crucible. The calcium chloride layer melts at an elevated temperature and forms a layer of liquid encapsulant between silicon and crucible. This liquid layer acts as a release agent during the solidification of silicon melt in the quartz crucible.

The problem of cracking of ingots and crucibles during the directional solidification process is also addressed by using a graded crucible, as disclosed in U.S. Pat. No. 4,218,418. The graded silica crucible has a thin skin of high-density glass on the inner surface, while the silica wall varies in density and cristobalite phase content. The crucible is made by rapidly heating the inside surface of a sintered silica crucible to above its glass formation temperature and above the temperature at which cristobalite is formed and then cooling.

Most of the above mentioned methods either relate to complicated, high cost processing or tackle narrowly only part of the problems associated with quartz crucibles used in silicon crystallization. Therefore, cost-effective processing as well as alternative materials are persistently sought for the purpose of surface treatment of quartz crucibles to prevent aforementioned problems associated with the crucible.

SUMMARY OF THE INVENTION

There is disclosed, in accordance with the present invention, a novel method of forming a protective coating layer on crucible surfaces. In this invention there is deposited on the quartz crucible surfaces new proposed materials for crucible protection. The invention uses plasma spray technique for depositing the selected materials on the crucible surfaces. Plasma spray is a relatively mature technology for making coating layers in other arts. This technology uses hot plasma jet to accelerate and melt/soften powder particles that are fed into the jet. The high-speed particles/droplets deposit on a surface and form the desired protective coating for this novel application. The coating materials are selected for their non-reactivity with molten silicon, vitreous silica as well as graphite, over a wide range of temperatures, and for their suitability for forming an adhesive coating layer by the art of plasma spraying.

It is, therefore, the principal object of the present invention to provide a quartz crucible with protective coating layers on both sides of the crucible that is used for silicon crystallization. Another object of the present invention is to provide a crucible with protective layer on the inner side of the crucible to prevent the fusion between the silicon melt and the fused silica surface.

A further object of the present invention is to provide a protective layer on the inner side of a crucible to minimize the releasing of contaminants from the gradually devitrified silica surface into the silicon melt.

It is another object of the present invention to provide a coating layer on the outer surface of a crucible to prevent the reactions between the graphite susceptor and the silica surface at high temperatures.

Still a further object of the present invention is to provide a quartz crucible that shows a high physical stability under a high temperature to which the crucible is subjected in crystal growth process.

It is another object of the present invention to provide materials for the aforementioned coating layers.

Yet further object of the present invention is to provide a method for producing the aforementioned coating layers.

Still other objects of the present invention will become readily apparent to those skilled in the art from the following detailed description, wherein only the preferred embodiment of the invention is described, simply by way of illustration of the best mode contemplated for carrying out the invention. As will be realized, the invention is capable of other and different embodiments and its several details are capable of modifications in various obvious respects, all without departing from the invention.

DETAILED DESCRIPTION OF THE PREFERRED EMBODIMENT

The present invention is directed to a quartz crucible which is used either for single crystal growth as in CZ furnaces or for polycrystalline silicon production as in directional solidification furnaces. The crucible is coated with a thin layer of selected materials on both inner and outer surfaces. There is disclosed a method for depositing the selected materials on the crucible surfaces. In this method, an arc plasma torch is used to generate high temperature and high speed plasma jet. Coating materials that are usually in powder form are fed into the plasma flame. Powder particles are softened or melted and accelerated by the jet, and thereafter, impact on the crucible surfaces to form the desired coating layer.

The coating materials are chosen according to their non-reactivity with molten silicon, vitreous silica as well as graphite in a wide range of temperatures. The selection of powder materials is also restricted by the possibility of forming adhesive coating layer by the art of plasma spraying. The produced coating layer on the inner surface prevents the fusion between the silicon melt and the vitreous silica, which normally leads to cracking of silicon ingot and/or crucible, particularly in directional solidification of silicon when silicon solidifies. Also, the inner layer of coating reduces the amount of contaminants released from the surface of silica because of the gradual devitrification of silica. The coating layer on the outer surface of the crucible, which is usually in contact with a graphite susceptor, avoids the reactions between graphite and silica, and reinforces the quartz crucible.

Materials in contact with the silicon melt and the silica crucible must have the unique property that they must be thermodynamically more stable than the silica at the high temperatures involved in silicon melt and crystal growth process. For oxidic materials in such cases the reaction of the type $$2 MO_x (s) + x Si (l) \rightarrow 2 M [in Si (l)] + x SiO_2 (s)$$

(with 'x' typically=1.0, 1.5 or 2.0) will not occur, thereby preventing contamination of the silicon melt by metal M. The Gibbs free energy change, $\Delta G°_T$, for such reactions is a guideline for selecting such materials. In addition, the reaction of $MO_x$ with the silica can be minimized or even eliminated if the material is already a reacted binary, ternary or quaternary oxide. The formation of such compounds further reduces the activity of the individual oxides, thus preventing reactions with silica at high temperatures. Such basic criteria are met by oxides of the alkaline earth elements, such as beryllium oxide BeO, magnesium oxide MgO, calcium oxide CaO, strontium oxide SrO and barium oxide BaO, the transition metal oxides such as titanium oxide $TiO_2$, zirconium oxide $ZrO_2$ and hafnium oxide $HfO_2$, aluminum oxide $Al_2O_3$, and the lanthanide sesquioxides $M_2O_3$.

The secondary criteria are met by such binary oxides such as magnesium zirconate $MgZrO_3$, calcium zirconate $CaZrO_3$, strontium zirconate $SrZrO_3$, barium zirconate $BaZrO_3$, etc, and by (yttria or calcia) stabilized zirconium oxides. Many of these compounds, in addition, possess simple cubic crystal structures that have isotropic thermal expansions which assist their stability at high temperatures.

The most preferred materials for protecting silica crucibles at high temperature in silicon processing are the reacted binary oxides of alkaline earth oxide-zirconium oxide, such as magnesium zirconate $MgZrO_3$, barium zirconate $BaZrO_3$ and stabilized zirconium oxides.

For crucibles used for directional solidification of polycrystalline silicon, there is another requirement for the coating layer or coating materials. The solidifying silicon shall not adhere to the coating. Because of the stable, non-reactive nature of the materials mentioned above, the release coatings formed by most of these materials could fulfill this requirement consequentially.

Because of the characteristics of the plasma spray system employed in the disclosed process, the form and other physical properties of the coating materials should satisfy the requirements of the deposition system. Generally, the material shall be in powder form with a proper size distribution so that the material can be fed into the system and be properly sprayed by the high-speed plasma jet. The material shall be chemically and physically stable in the high temperature plasma jet, i.e., neither reaction with plasma gas nor thermal decomposition of the material occurs when the surface temperature of the powder particles reaches about 2000 to 3000° C.

Plasma spray deposition technique is used for the crucible coating of the disclosed materials for the sake of its high efficiency in terms of throughput, processing step, energy and ease of operation. Also, the high temperature feature of plasma spray process facili- tates the deposition of the above mentioned ceramic materials which generally have very high melting points.

In a plasma spray deposition system, a plasma jet is formed by a DC plasma torch with high temperature in the order of 14,000 K at peak, and high velocity, in the order of 3000 m/s at peak. The primary plasma gas is usually argon, helium, nitrogen, hydrogen or their combinations. The coating materials in powder form, with sizes of about 5 to 100 μm, are fed into the plasma jet through one or more powder feeders. The powder particles are accelerated and heated up rapidly to velocities of about 50–200 m/s, temperatures of about 2000 to 3000° C. by the plasma jet. The high-speed softened or melted particles impact on the substrate surface and solidify rapidly to form the desired coatings.

The coating properties are determined by the coating materials, the characteristics of the impacting particles, including size, velocity, temperature and phase, and the characteristics of the substrate surface, such as substrate material, roughness, temperature, and so on. The characteristics of the impacting particles are affected by the operating conditions of the plasma spray system, which include the electrical power input as voltage and current, the flow rate of plasma gases, the feeding rate of powder, the position of the feeding port, the standoff of the substrate, and so on. During a plasma spray process, the parameters that can be easily controlled are normally the power input, plasma gas flow rate, powder feeding rate, the standoff of substrate and the substrate surface temperature.

For the coating materials listed as EXAMPLES 1–3, the spray conditions used for the Metco-7MB plasma spray system are the same and listed in the following table:

TABLE #1

Spray Conditions

| Parameters | setting |
| --- | --- |
| Power input (kw) | 26 |
| Current (A) | 400 |
| Voltage (volt) | 35 |
| Argon flow rate (slm) | 30 |
| Hydrogen flow rate (slm) | 2.5 |
| Powder feeding rate g/min | 30–35 |
| Crucible surface | Rough/smooth |
| Surface preheating | With/without |

In the coating process the substrate was rotated or the plasma spray gun was rastered to provide a uniform spray pattern and material delivery throughout the coating schedule. Single spray pass typically coated 0.001"–0.002" thick of material; in several tests multipass coating provided 0.008"–0.010" thick coating on the substrate. Substrate post-treatment consisted of simply switching off the powder feed supply, and then either not or continuing the plasma heat for several seconds. The plasma spray process lends itself for a variety of flexible coating process schedules that can be customized for any combination of substrate and coating material.

The adhesiveness of the coating on the quartz substrate with roughened surface was good as evidenced by simple scratch tests. In the case of smooth surfaces adhesiveness improved significantly by an initial preheat of the substrate.

The following examples reveal the specifications of materials used for the plasma spray deposited protective coatings.

| Material | Magnesium Zirconate |
|---|---|
| Powder type | Metco 210 |
| Composition | 24% MgO + 76% ZrO$_2$ |
| Particle size | −53 + 10 microns |
| Melting point | 2140° C. |

| Material | Yttria-Stabilized Zirconium Oxide |
|---|---|
| Powder type | Metco 204 NS |
| Composition | 92% ZrO$_2$ + 8% Y$_2$O$_3$ |
| Particle size | −106 + 10 microns |
| Melting point | 2480° C. |

| Material | Barium Zirconate |
|---|---|
| Powder type |  |
| Composition | 55% BaO + 45% ZrO$_2$ |
| Particle size | −100 + 10 microns |
| Melting point | 2600° C. |

The above description of a preferred embodiment is exemplary of the invention, but not exhaustive. The invention is capable of other and various embodiments, all within the scope of the appended claims. For example, there is a method for applying a protective coating on a quartz crucible for use in silicon crystallization processes, consisting of the steps of arranging the crucible within deposition range of a plasma jet apparatus, supplying the plasma jet apparatus with a powdered form of a thermodynamically stable coating material that is not reactive with molten silicon, vitreous silica or graphite in the temperature range of the silicon crystallization processes, and depositing with the plasma jet apparatus a protective layer of the coating material on the surface of the crucible.

The coating material may consist of at least one from among the group of materials consisting of oxides of alkaline earth elements, oxides of transition metals, lanthanide sesquioxides, aluminum oxide, and binary, tertiary and quaternary metal oxides. The oxides of alkaline earth elements may include beryllium oxide BeO, magnesium oxide MgO, calcium oxide CaO, strontium oxide SrO, and barium oxide BaO. The oxides of transition elements may include titanium oxide TiO$_2$, zirconium oxide ZrO$_2$, and hafnium oxide HfO$_2$. The binary, tertiary, and quaternary metal oxides may include magnesium zirconate MgZrO$_3$, calcium zirconate CaZrO$_3$, strontium zirconate SrZrO$_3$, barium zirconate BaZrO$_3$, zirconium oxides stabilized by yttria, and zirconium oxides stabilized by calcia.

The surface of the crucible may be just the inner surface or may include the inner and outer surfaces. The temperature range of the plasma jet may extend to about 1400° Centigrade.

The plasma jet may be an arc plasma torch. The powdered form of materials may consist of particles ranging in size between about 5 µm and about 100 µm. The protective layer when completed may be between about 0.001 inches and about 0.010 inches thick.

Other examples within the scope of the invention and the appended claims will be readily apparent to those skilled in the art.

We claim:

1. A method for applying a protective coating on a quartz crucible for use in silicon crystallization processes, comprising the steps:

arranging said crucible within deposition range of a plasma jet apparatus, supplying said plasma jet apparatus with a powered form of a thermodynamically stable coating material that is not reactive with molten silicon, vitreous silica or graphite in the temperature range of said molten silicon, and depositing with said plasma jet apparatus a protective layer of said coating material on the surface of said crucible.

2. A method for applying a protective coating according to claim 1, said coating material comprising at least one from among the group of materials consisting of oxides of alkaline earth elements, oxides of transition metals, lanthanide sesquioxides, aluminum oxide, and binary, tertiary and quaternary metal oxides.

3. A method for applying a protective coating according to claim 2, said oxides of alkaline earth elements being selected from the group consisting of beryllium oxide, magnesium oxide, calcium oxide, strontium oxide, and barium oxide.

4. A method for applying a protective coating according to claim 2, said oxides of transition elements being selected from the group consisting of titanium oxide, zirconium oxide, and hafnium oxide.

5. A method for applying a protective coating according to claim 2, said binary, tertiary, and quaternary metal oxides being selected from the group consisting of magnesium zirconate, calcium zirconate, strontium zirconate, barium zirconate, zirconium oxides stabilized by yttria, and zirconium oxides stabilized by calcia.

6. A method for applying a protective coating according to claim 1, said surface of said crucible comprising at least the inner surface.

7. A method for applying a protective coating according to claim 1, said plasma jet comprising an arc plasma torch.

8. A method for applying a protective coating according to claim 1, said powdered form comprising particles ranging in size between about 5 µm and about 100 µm.

9. A method for applying a protective coating according to claim 1, said protective layer when completed being between about 0.001 inches and about 0.010 inches thick.

10. A method for applying a protective coating according to claim 1, said coating material being chemically and physically stable when the temperature of the powered form is about between 2000 and 3000 degrees Centigrade.

11. A method for applying a protective coating on a quartz crucible for use in silicon crystallization processes, comprising the steps:

arranging said crucible within deposition range of a plasma jet apparatus, supplying said plasma jet apparatus with a powered form of a thermodynamically stable dry coating material, said coating material comprising at least one from the group of materials consisting of oxides of alkaline earth elements, oxides of transition metals, lanthanide sesquioxides, aluminum oxide, and binary, tertiary and quaternary metal oxides, and depositing with said plasma jet apparatus a protective layer of said coating material on the surface of said crucible.

12. A method for applying a protective coating according to claim 11, said oxides of alkaline earth elements being selected from the group consisting of beryllium oxide, magnesium oxide, calcium oxide, strontium oxide, and barium oxide.

13. A method for applying a protective coating according to claim 11, said oxides of transition elements being selected from the group consisting of titanium oxide, zirconium oxide, and hafnium oxide.

14. A method for applying a protective coating according to claim 11, said binary, tertiary, and quaternary metal oxides being selected from the group consisting of magnesium zirconate, calcium zirconate, strontium zirconate, barium zirconate, zirconium oxides stabilized by yttria, and zirconium oxides stabilized by calcia.

15. A method for applying a protective coating according to claim 11, said plasma jet comprising an arc plasma torch with a temperature range extending to about 1400° Centigrade.

16. A method for applying a protective coating according to claim 15, said powdered form comprising particles ranging in size between about 5 $\mu$m and about 100 $\mu$m, said protective layer when completed being between about 0.001 inches and about 0.010 inches thick.

17. A method for applying a protective coating on a quartz crucible for use in silicon crystallization processes, comprising the steps:

arranging said crucible within deposition range of an arc plasma torch apparatus with a temperature range extending to about 1400° Centigrade, supplying said arc plasma torch apparatus with a powered form of a thermodynamically stable coating material comprising at least one from among the group of materials consisting of oxides of alkaline earth elements, oxides of transition metals, lanthanide sesquioxides, aluminum oxide, and binary, tertiary and quaternary metal oxides, said powdered form comprising particles ranging in size between about 5 $\mu$m and about 100 $\mu$m, and depositing with said arc plasma torch apparatus a protective layer of said material on the surface of said crucible, said protective layer when completed being between about 0.001 inches and about 0.010 inches thick.

18. A method for applying a protective coating according to claim 17, said oxides of alkaline earth elements being selected from the group consisting of beryllium oxide, magnesium oxide, calcium oxide, strontium oxide, and barium oxide.

19. A method for applying a protective coating according to claim 17, said oxides of transition elements being selected from the group consisting of titanium oxide, zirconium oxide, and hafnium oxide.

20. A method for applying a protective coating according to claim 17, said binary, tertiary, and quaternary metal oxides being selected from the group consisting of magnesium zirconate, calcium zirconate, strontium zirconate, barium zirconate, zirconium oxides stabilized by yttria, and zirconium oxides stabilized by calcia.

* * * * *

UNITED STATES PATENT AND TRADEMARK OFFICE
CERTIFICATE OF CORRECTION

PATENT NO. : 6,479,108 B2
DATED : November 12, 2002
INVENTOR(S) : Alleppey V. Hariharan et al.

It is certified that error appears in the above-identified patent and that said Letters Patent is hereby corrected as shown below:

Column 8,
Line 53, delete "dry"

Signed and Sealed this

Thirteenth Day of July, 2004

JON W. DUDAS
*Acting Director of the United States Patent and Trademark Office*